(12) United States Patent
Chang et al.

(10) Patent No.: US 10,438,842 B2
(45) Date of Patent: Oct. 8, 2019

(54) METHOD OF FABRICATING CONTACT HOLE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Shih-Fang Tzou, Tainan (TW); Fu-Che Lee, Taichung (TW); Hsin-Yu Chiang, Kaohsiung (TW); Yu-Ching Chen, Kaohsiung (TW)

(73) Assignees: UNITED MICROELECTRONICS CORP., Hsin-Chu (TW); Fujian Jinhua Ingtegrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/003,126

(22) Filed: Jun. 8, 2018

(65) Prior Publication Data
US 2019/0206724 A1 Jul. 4, 2019

(30) Foreign Application Priority Data
Dec. 29, 2017 (CN) .......................... 2017 1 1470650

(51) Int. Cl.
H01L 21/4763 (2006.01)
H01L 21/768 (2006.01)
H01L 21/311 (2006.01)

(52) U.S. Cl.
CPC .. *H01L 21/76805* (2013.01); *H01L 21/31116* (2013.01); *H01L 21/31144* (2013.01); *H01L 21/76897* (2013.01)

(58) Field of Classification Search
None
See application file for complete search history.

(56) References Cited

U.S. PATENT DOCUMENTS

| 6,740,592 | B1 | 5/2004 | Doong | |
|---|---|---|---|---|
| 7,319,067 | B2 | 1/2008 | Chou | |
| 7,432,194 | B2 | 10/2008 | Chou | |
| 7,820,508 | B2 * | 10/2010 | Oh | H01L 21/31116 257/E21.014 |
| 8,450,216 | B2 * | 5/2013 | Teo | H01L 21/28518 438/740 |
| 2004/0132246 | A1 | 7/2004 | Kim | |
| 2007/0093055 | A1 | 4/2007 | Chou | |

(Continued)

*Primary Examiner* — Hung K Vu
(74) *Attorney, Agent, or Firm* — Winston Hsu

(57) ABSTRACT

A method of fabricating a contact hole includes the steps of providing a conductive line, a mask layer covering and contacting the conductive line, a high-k dielectric layer covering and contacting the mask layer, and a first silicon oxide layer covering and contacting the high-k dielectric layer, wherein the high-k dielectric layer includes a first metal oxide layer, a second metal oxide layer and a third metal oxide layer stacked from bottom to top. A dry etching process is performed to etch the first silicon oxide layer, the high-k dielectric layer, and the mask layer to expose the conductive line and form a contact hole. Finally, a wet etching process is performed to etch the first silicon oxide layer, the third metal oxide layer and the second metal oxide layer to widen the contact hole, and the first metal oxide layer remains after the wet etching process.

6 Claims, 7 Drawing Sheets

(56) References Cited

U.S. PATENT DOCUMENTS

2010/0285658 A1 11/2010 Yeh
2011/0115090 A1* 5/2011 Lin .................... H01L 21/0276
                                                                257/750

* cited by examiner

METHOD OF FABRICATING CONTACT HOLE

BACKGROUND OF THE INVENTION

1. Field of the Invention

The present invention relates to a method of fabricating a contact hole, and more particularly to a method of forming a contact hole by using a dry etching process followed by a wet etching process.

2. Description of the Prior Art

A semiconductor integrated circuit device has circuit components fabricated on a semiconductor substrate, and wirings which extend over an inter-level insulating layer laminated on the semiconductor substrate. Contact holes are formed in the inter-level insulating layer, and the wirings provide signal paths through the contact holes between the circuit components.

A contact hole for an electric connection of a lower layer and an upper layer is provided during the semiconductor fabricating process.

When etching the inter-level insulating layer to forma contact hole, some shift will always occur in the etching mask, however. This results in the shift of the contact hole. The shifted contact hole may not stop on a predetermined conductive layer and may penetrate the inter-level insulating layer to reach an unintended conductive layer, which causes an undesired electrical connection.

SUMMARY OF THE INVENTION

Therefore, it would be an advantage in the art to provide a method of fabricating a contact hole which reduces the undesired electrical connection.

According to a first preferred embodiment of the present invention, a method of fabricating a contact hole, comprising the steps of providing a conductive line, a mask layer covering and contacting the conductive line, a high-k dielectric layer covering and contacting the mask layer, and a first silicon oxide layer covering and contacting the high-k dielectric layer, wherein the high-k dielectric layer comprises a first metal oxide layer, a second metal oxide layer and a third metal oxide layer stacked from bottom to top. Next, a dry etching process is performed to etch the first silicon oxide layer, the high-k dielectric layer, and the mask layer to expose the conductive line and form a contact hole. Finally, a wet etching process is performed to etch the first silicon oxide layer, the third metal oxide layer and the second metal oxide layer to widen the contact hole, and the first metal oxide layer remains after the wet etching process.

According to a second preferred embodiment of the present invention, a method of fabricating a contact hole, comprises providing a conductive line, a mask layer covering and contacting the conductive line, a high-k dielectric layer covering and contacting the mask layer, and a first silicon oxide layer covering and contacting the high-k dielectric layer, wherein the high-k dielectric layer comprises only a metal oxide layer. Later, a dry etching process is performed to etch the first silicon oxide layer, the high-k dielectric layer, and the mask layer to expose the conductive line and form a contact hole. Finally, a wet etching process is performed to etch the first silicon oxide layer, the high-k dielectric layer and the mask layer to widen the contact hole.

According to a third preferred embodiment of the present invention, a method of fabricating a contact hole comprises providing a conductive line, a mask layer covering and contacting the conductive line and a first silicon oxide layer covering and contacting the mask layer. Then, a dry etching process is performed to etch the first silicon oxide layer and the mask layer to expose the conductive line and form a contact hole. Finally, a wet etching process is performed to etch the first silicon oxide layer to widen the contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3, FIG. 6 to FIG. 8 and FIG. 11 depict a method of fabricating a contact hole according to a first preferred embodiment of the present invention, wherein:

FIG. 2 is a fabricating stage following FIG. 1;

FIG. 3 depicts a magnified view of the circular region in FIG. according to the first preferred embodiment of the present invention;

FIG. 6 is a fabricating stage following FIG. 2;

FIG. 7 is a fabricating stage following FIG. 6;

FIG. 8 depicts a magnified view of the circular region in FIG. 7 according to the first preferred embodiment of the present invention; and FIG. 11 is a fabricating stage following FIG. 8.

FIG. 4, FIG. 9 and FIG. 12 depict a method of fabricating a contact hole according to a second preferred embodiment of the present invention, wherein:

FIG. 4 depicts a magnified view of the circular region in FIG. according to the second preferred embodiment of the present invention;

FIG. 9 depicts a magnified view of the circular region in FIG. according to the second preferred embodiment of the present invention; and FIG. 12 follows FIG. 9 according to the second preferred embodiment of the present invention.

FIG. 5, FIG. 10 and FIG. 13 depict a method of fabricating a contact hole according to a third preferred embodiment of the present invention, wherein:

FIG. 5 depicts a magnified view of the circular region in FIG. 2 according to a third preferred embodiment of the present invention;

FIG. 10 depicts a magnified view of the circular region in FIG. 7 according to the third preferred embodiment of the present invention; and FIG. 13 is continued from FIG. 10 according to the third preferred embodiment of the present invention.

DETAILED DESCRIPTION

Figure 1:
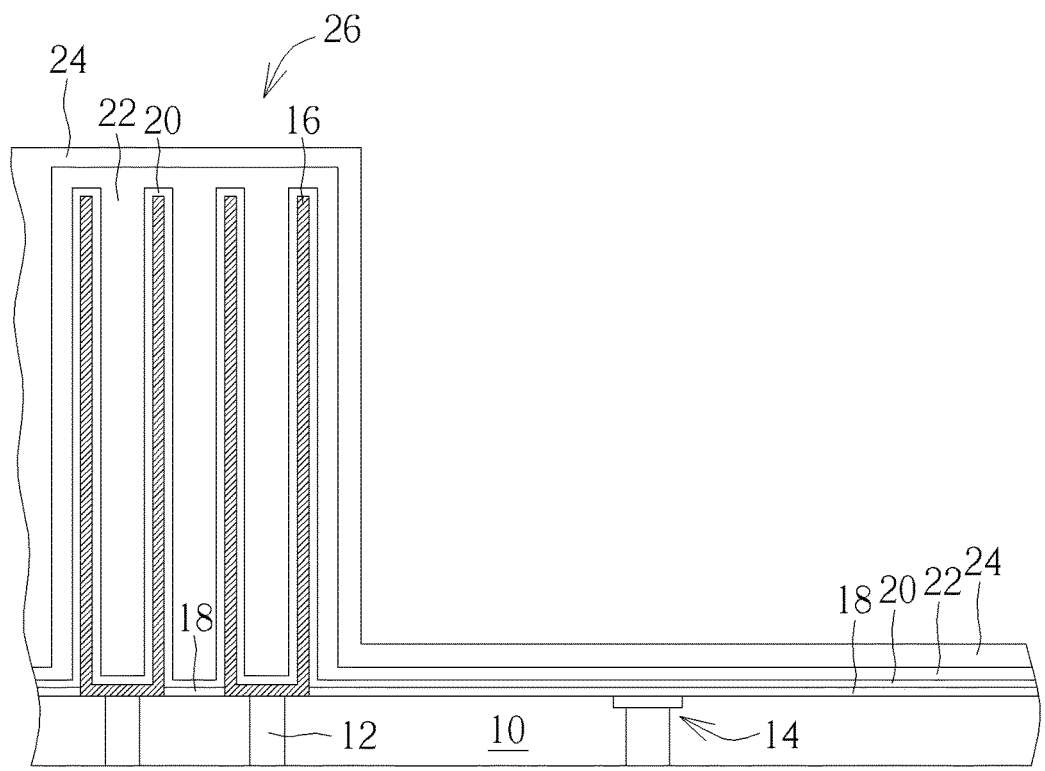

As shown in FIG. 1, a dielectric layer 10 is provided. A capacitor plug 12 and a conductive line 14 are disposed within the dielectric layer 10. The conductive line 14 may be a metal plug. A capacitor bottom electrode 16 is disposed on the dielectric layer 10. A mask layer 18 covers part of the dielectric layer 10 and extends to the conductive line 14 to cover the conductive line 14. A high-k dielectric layer 20 conformally covers the capacitor bottom electrode 16 and extends to the conductive line 14 to cover the conductive line 14. A capacitor top electrode 22 covers the high-k dielectric layer 20 and extends to the conductive line 14 to cover the conductive line 14. A protective layer 24 covers the capacitor top electrode 22 and extends to the conductive line 14 to cover the conductive line 14. The capacitor plug 12 electrically connects the capacitor bottom electrode 16. The capacitor bottom electrode 16, the high-k dielectric layer 20, and the capacitor top electrode 22 constitute a capacitor 26.

The dielectric layer 10 may be silicon nitride, silicon oxide, silicon oxynitride or other insulating materials. The mask layer 18 may be silicon nitride, silicon carbonitride, or other insulating materials. If the mask layer 18 is silicon carbonitride, the atomic percentage of carbon in the silicon carbonitride is between 5 at % and 40 at %. The capacitor top electrode 22 and the capacitor bottom electrode 16 may be Pt, W, WN, TiN, TaN or other conductive materials. The protective layer 24 may include silicon germanium, tungsten or silicon oxide.

According to a first preferred embodiment, the high-k dielectric layer 20 includes a first metal oxide layer, a second metal oxide layer and a third metal oxide layer stacked from bottom to top. The first metal oxide layer is preferably zirconium oxide. The second metal oxide layer is preferably aluminum oxide. The third metal oxide layer is preferably zirconium oxide. In other words, the first metal oxide layer and the third metal oxide layer are made of the same material.

Figure 2:
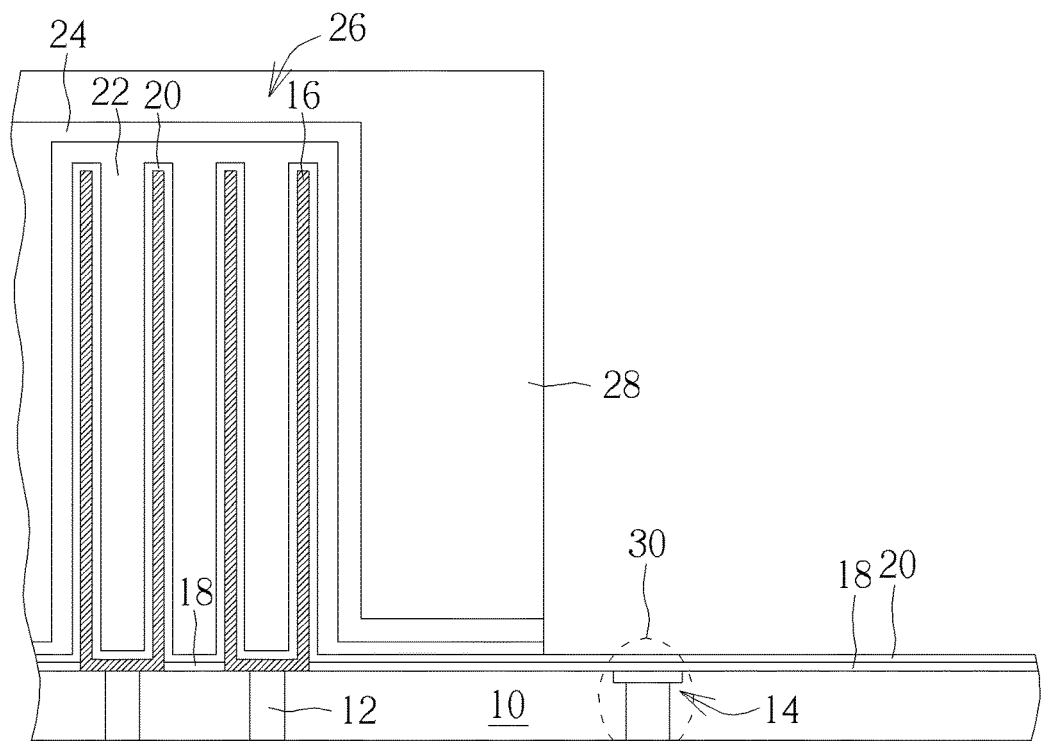

As shown in FIG. 2, an etching mask 28 covers the capacitor 26. At this point, the mask layer 18, the high-k dielectric layer 20, the capacitor top electrode 22 and the protective layer 24 directly on the conductive line 14 are not covered by the etching mask 28. Next, the protective layer 24, the capacitor top electrode 22 which are not covered by the etching mask 28 are removed. Furthermore, part of the high-k dielectric layer 20 is optionally removed. A circular region 30 in FIG. 2 marks the positions of the conductive line 14, the mask layer 18 on the conductive line 14 and high-k dielectric layer 20 on the conductive line 14.

Figure 3:
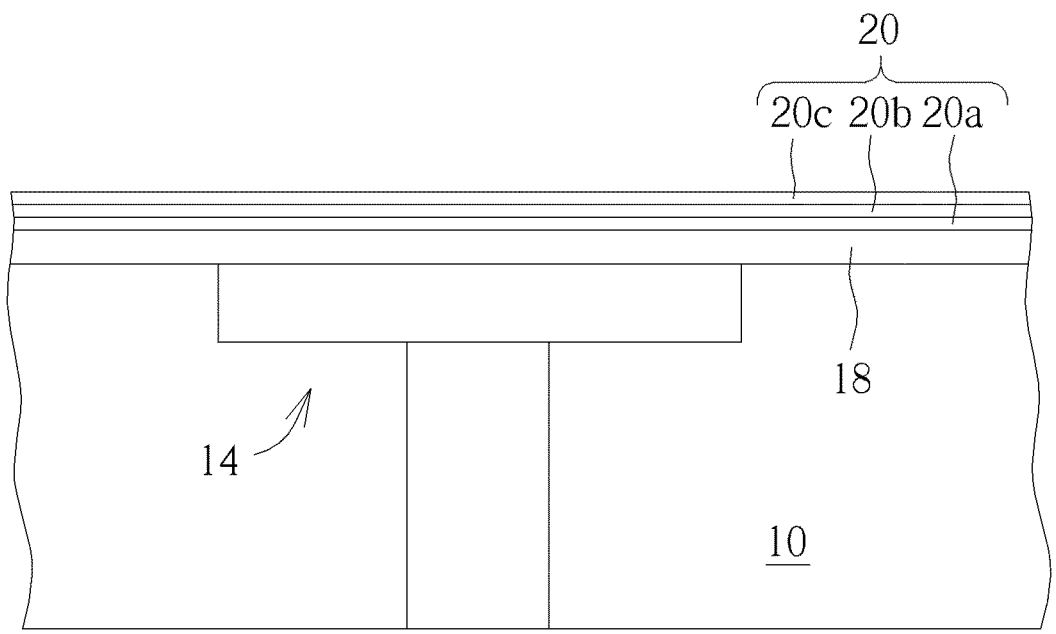
Figure 4:
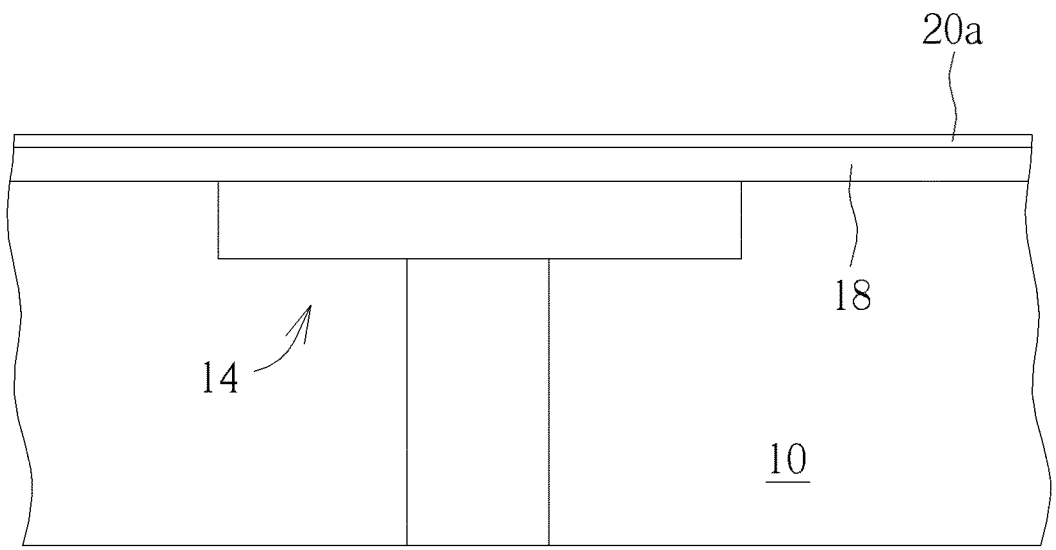
Figure 5:
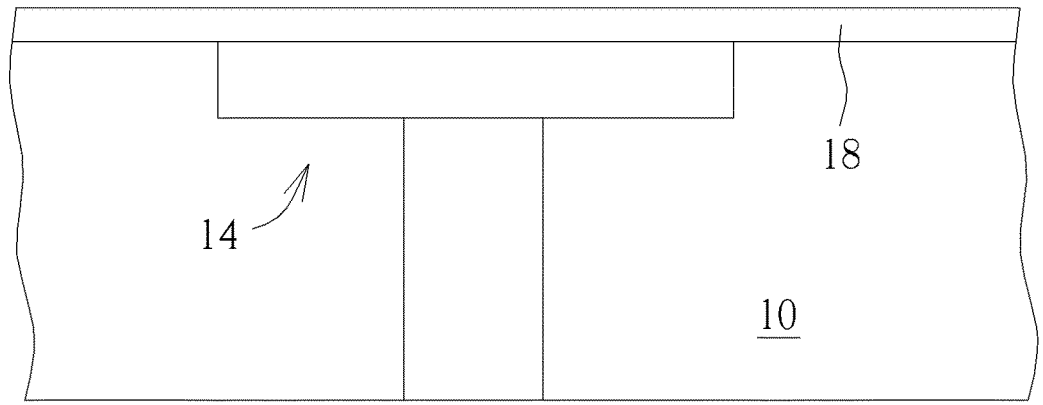

FIG. 3, FIG. 4 and FIG. 5 depict a magnified view of the circular region 30. In detail, FIG. 3 depicts a magnified view of the circular region in FIG. 2 according to a first preferred embodiment of the present invention. FIG. 4 depicts a magnified view of the circular region in FIG. 2 according to a second preferred embodiment of the present invention. FIG. 5 depicts a magnified view of the circular region in FIG. 2 according to a third preferred embodiment of the present invention. According to the first preferred embodiment, as shown in FIG. 2 and FIG. 3, the high-k dielectric layer 20 includes a first metal oxide layer 20a, a second metal oxide layer 20b and a third metal oxide 20c stacked from bottom to top. Then, the protective layer 24, the capacitor top electrode 22 are etched by taking the etching mask 28 as a mask and taking the third metal oxide layer 20c of the high-k dielectric layer 20 as an etching stop layer. In detail, the third metal oxide layer 20c remains after the protective layer 24 and the capacitor top electrode 22 are etched. The surface of the third metal oxide layer 20c which remains is damaged during etching of the protective layer 24 and the capacitor top electrode 22, however. According to the second preferred embodiment, as shown in FIG. 2 and FIG. 4, the protective layer 24 and the capacitor top electrode 22 are etched by taking the etching mask 28 as a mask and taking the first metal oxide layer 20a of the high-k dielectric layer 20 as an etching stop layer. In other words, the third metal oxide layer 20c and the second metal oxide layer 20b of the high-k dielectric layer 20 are removed. A surface of the first metal oxide layer 20a which remains is damaged. According to a third preferred embodiment, as shown in FIG. 2 and FIG. 5, the high-dielectric layer 20 which is not covered by the etching mask 28 is entirely removed by taking the mask layer 18 as an etching stop layer.

Figure 6:
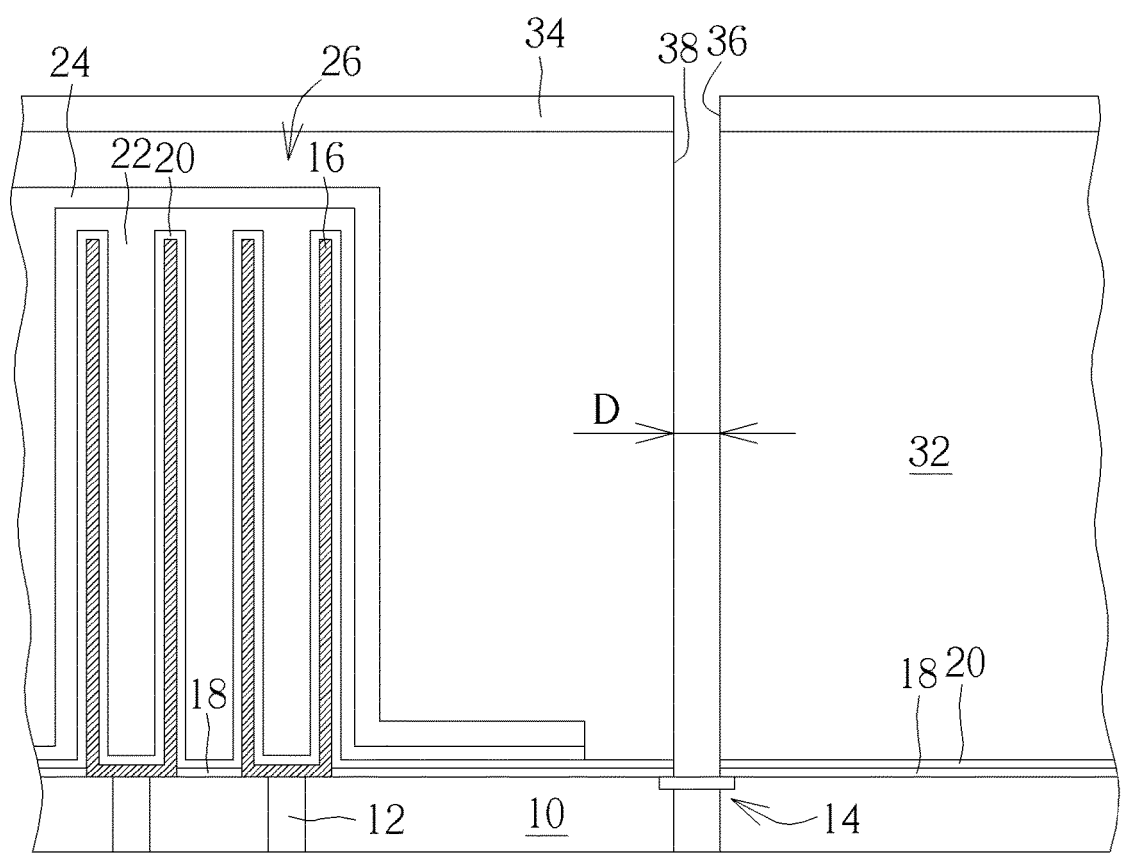
Figure 7:
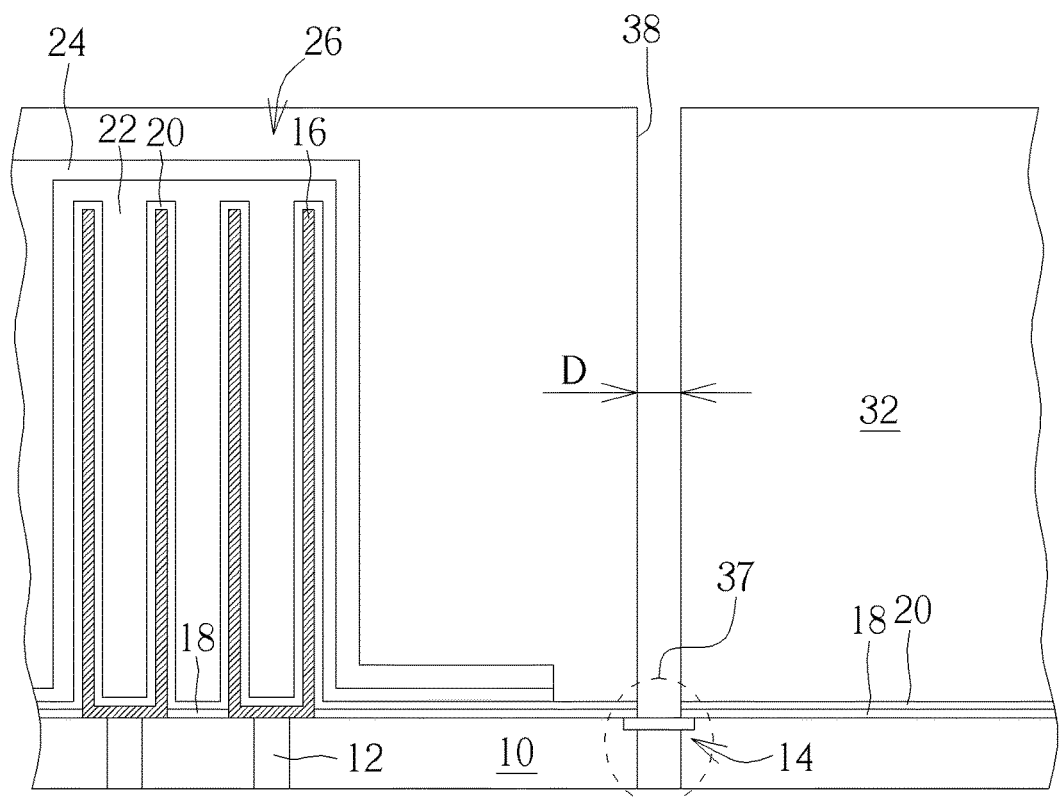

FIG. 6 continues from FIG. 2. As shown in FIG. 6, the etching mask 28 is removed. Later, a first silicon oxide layer 32 is formed to cover and contact the high-k dielectric layer 20. Then, an etching mask 34 is formed on the first silicon oxide layer 32 to cover the first silicon oxide layer 32. A contact hole pattern 36 is within the etching mask 34. After that, the first silicon oxide layer 32, the high-k dielectric layer 20 and the mask layer 18 are dry etched to expose the conductive line 14 and to form a contact hole 38. The contact hole 38 has a diameter D. FIG. 7 continues from FIG. 6. As shown in FIG. 7, the etching mask 34 is removed. For example, the etching mask 34 is removed by using oxygen gas to oxidize the etching mask 34. During removal of the etching mask 34, part of the mask layer 18 is oxidized to become a second oxide layer. A circular region 37 marks the conductive line 14 and the positions of the mask layer 18, the high-k dielectric layer 20 and the contact hole on the conductive line 14.

Figure 8:
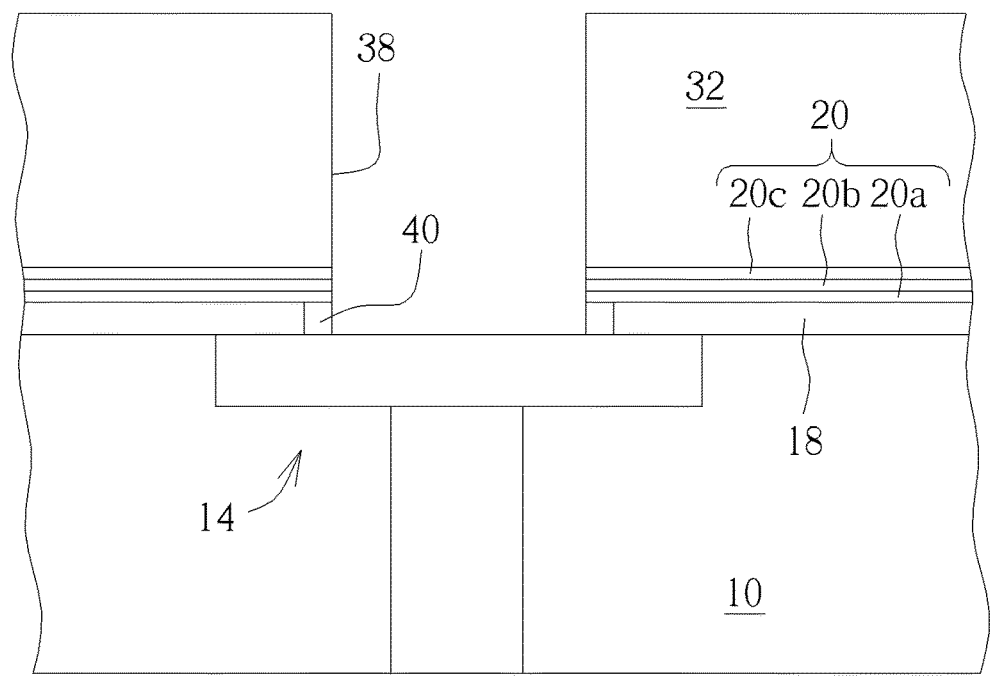
Figure 9:
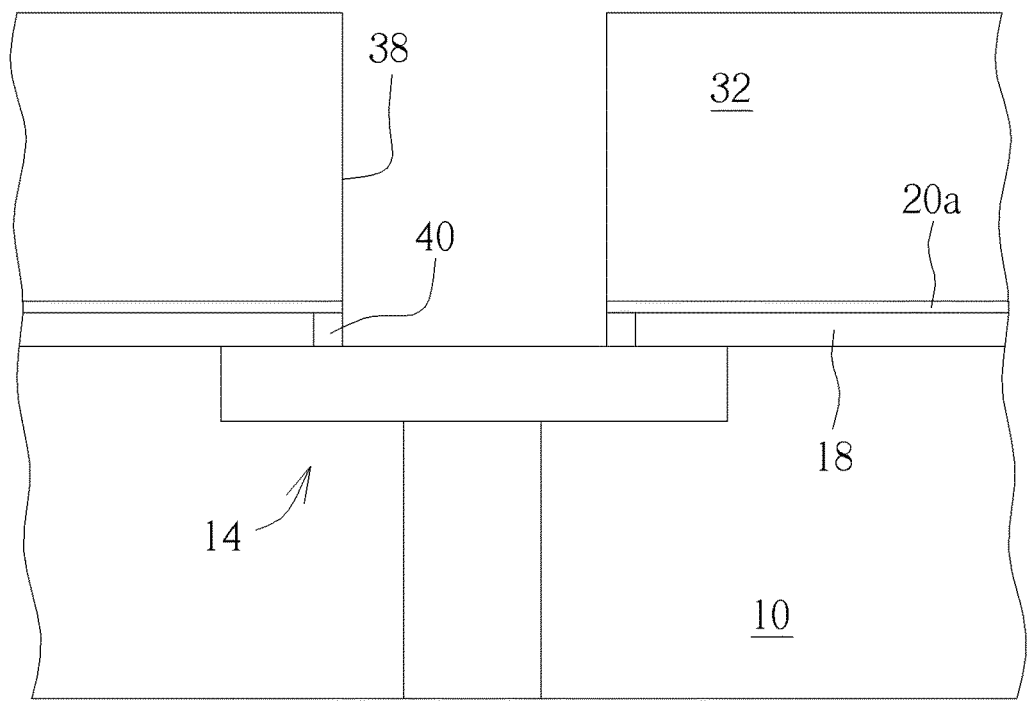
Figure 10:
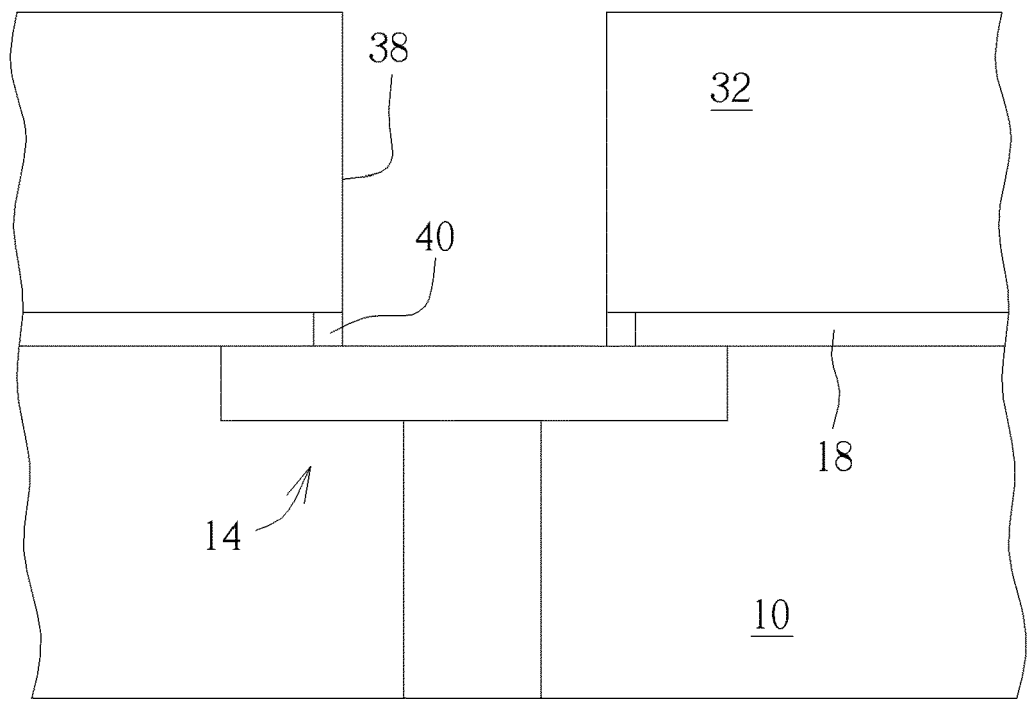

FIG. 8, FIG. 9 and FIG. 10 respectively depict a magnified view of the circular region 37 according to the first preferred embodiment, the second preferred embodiment and the third preferred embodiment of the present invention. For the sake of simplicity, the second silicon oxide layer is omitted in FIG. 7 and is shown in FIG. 8, FIG. 9 and FIG. 10.

FIG. 8 depicts a magnified view of the circular region in FIG. 7 according to the first preferred embodiment of the present invention. FIG. 9 depicts a magnified view of the circular region in FIG. 7 according to the second preferred embodiment of the present invention. FIG. 10 depicts a magnified view of the circular region in FIG. 7 according to the third preferred embodiment of the present invention. Referring to FIG. 7 and FIG. 8, according to the first preferred embodiment of the present invention, after removing the etching mask 34, part of the mask layer 18 is oxidized to form the second silicon oxide layer 40 surrounding the contact hole 38. Referring to FIG. 7 and FIG. 9, according to the second preferred embodiment of the present invention, after removing the etching mask 34, part of the mask layer 18 is oxidized to form the second silicon oxide layer 40 surrounding the contact hole 38. Referring to FIG. 7 and FIG. 10, according to the third preferred embodiment of the present invention, after removing the etching mask 34, part of the mask layer 18 is oxidized to form the second silicon oxide layer 40 surrounding the contact hole 38. In the first preferred embodiment, the second preferred embodiment and the third embodiment of the present invention, the mask layer 18 may be silicon nitride or silicon carbonitride. The thickness of the silicon oxide layer 40 formed from the mask layer 18 made of silicon carbonitride is thicker than that of the silicon oxide layer 40 formed from the mask layer 18 made of silicon nitride. If the mask layer 18 is silicon carbonitride, the thickness of the silicon oxide layer 40 formed from the mask layer 18 with higher carbon percentage is thicker than that of the silicon oxide layer 40 formed from the mask layer 18 with lower carbon percentage.

Figure 11:
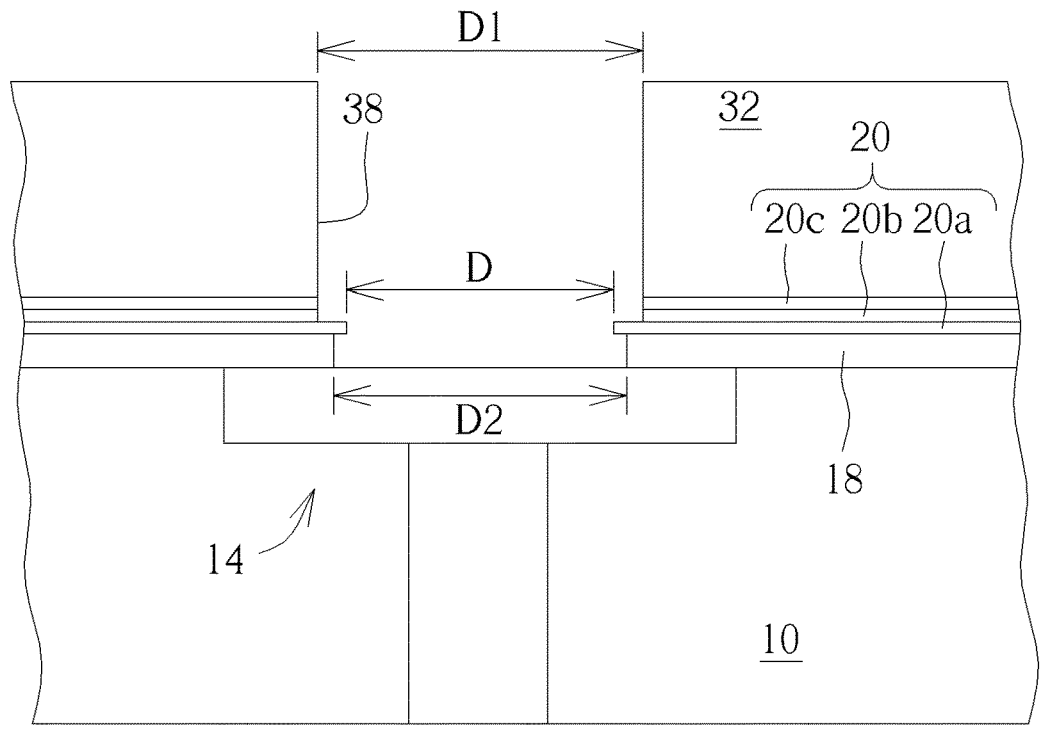

FIG. 11 continues from FIG. 8 according to the first preferred embodiment of the present invention. As shown in FIG. 11, after removing the etching mask 34, a wet etching process is performed to widen the contact hole 38. According to the first preferred embodiment, because the surface of the third metal oxide layer 20c is damaged by the step shown in FIG. 2, the etchant can remove the third metal oxide layer 20c during the wet etching process. The etchant cannot remove the first metal oxide layer 20a which is not damaged, however. Furthermore, the etchant of the wet etching process is originally designed for removing the second metal oxide layer 20b and silicon oxide. Therefore, the second silicon oxide layer 40 formed by the mask layer 18 are entirely removed by the etchant, but the mask layer 18 is not removed by the etchant. The etchant in the wet etching process is preferably diluted hydrofluoric acid. After the wet etching process, the first silicon oxide layer 32 becomes thinner. Part of the first silicon oxide layer 32 defining the sidewall of the contact hole 38 is removed. Therefore, the diameter of the contact hole within the first silicon oxide layer 32 is widened. Moreover, during the wet etching process, after part of the first silicon oxide layer 32 is removed, part of the third metal oxide layer 20c is exposed and removed by the etchant. Then, after the part of the third metal oxide layer 20c is removed, the second metal oxide layer 20b exposed is removed as well. In the end, only the diameter D of the contact hole 38 in the first metal oxide layer 20a maintains its original size. The diameter of the contact hole 38 in the first silicon oxide layer 32, the third metal oxide layer 20c, the second metal oxide layer 20b and the mask layer 18 is widened from the diameter D. It is noteworthy that the diameter of the contact hole in the first silicon oxide layer 32, the third metal oxide layer 20c, the second metal oxide layer 20b and the mask layer 18 can be different or the same. Generally, the diameter of the contact hole 38 in the first silicon oxide layer 32 is widened more than the diameter of the contact hole 38 in the mask layer 18. According to a preferred embodiment of the present invention, the diameter D1 of the contact hole 38 in the first silicon oxide layer 32, the third metal oxide layer 20c and the second metal oxide layer 20b is the same. The diameter D1 is greater than the diameter D. The diameter D2 of the contact hole 38 in the mask layer 18 is smaller than the diameter D1.

Figure 12:
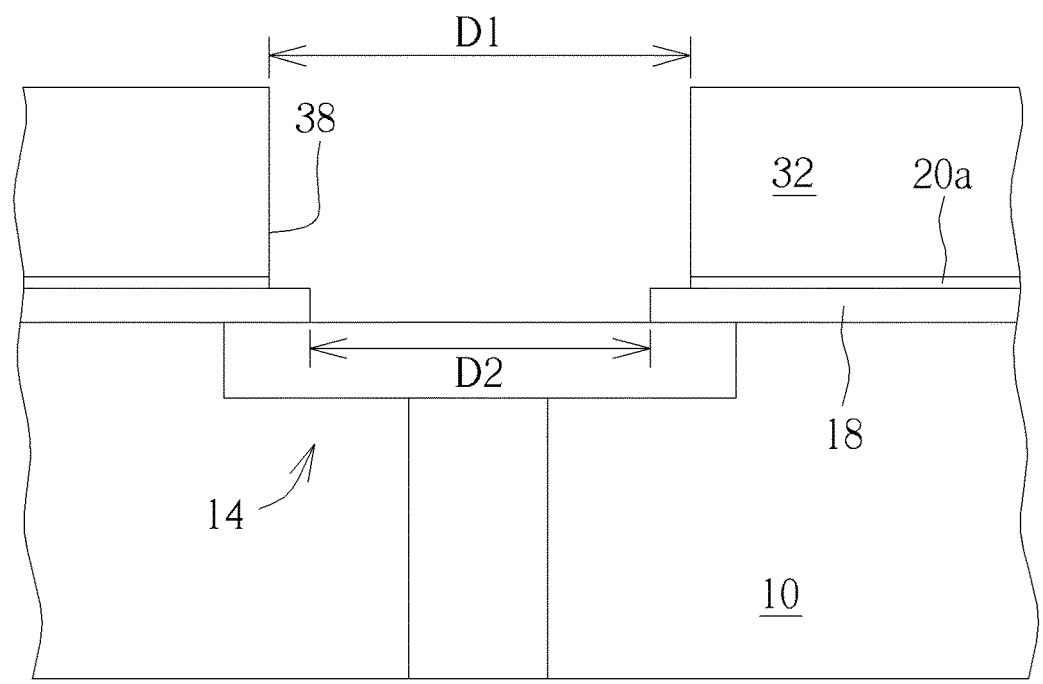

FIG. 12 continues from FIG. 9 according to the second preferred embodiment of the present invention. After removing the etching mask 34, a wet etching process is performed to widen the contact hole. 38. The wet etching process is preferably performed by using diluted hydrofluoric acid. According to the second preferred embodiment of the present invention, in the step shown in FIG. 2, the third metal oxide layer 20c and the second metal oxide layer 20b are both removed of the high-k dielectric layer 20, only the first metal oxide layer 20a with a damaged surface remains. During the wet etching process, part of the first silicon oxide layer 32 is removed to expose part of the first metal oxide layer 20a. Then, the exposed first metal oxide layer 20a is removed during the wet etching process. In the end, the diameter of the contact hole 38 in the first silicon oxide layer 32, the first metal oxide layer 20a and the mask layer 18 is widened. It is noteworthy that the diameter of the contact hole 38 in the first silicon oxide layer 32, in the first metal oxide layer 20a and in the mask layer 18 can be different or the same. In this embodiment, the diameter of the contact hole 38 in the first silicon oxide layer 32 and the diameter of the contact hole 38 in the first metal oxide layer 20a are both widened from diameter D to diameter D1. Moreover, the diameter D2 of the contact hole 38 in the mask layer 18 is smaller than the diameter D1 but larger than diameter D.

Figure 13:
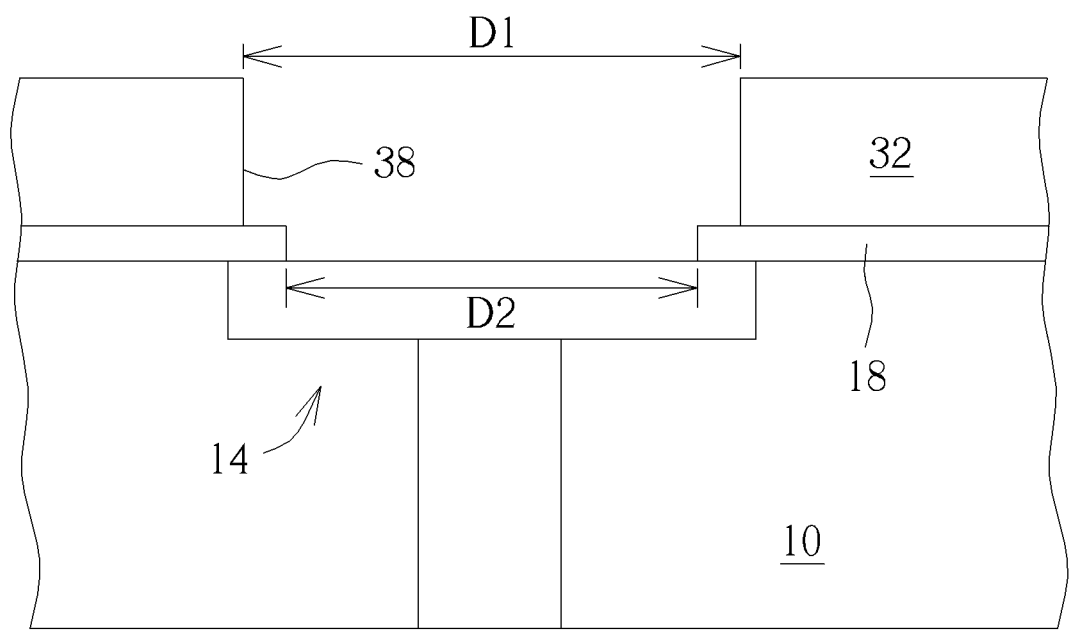

FIG. 13 continues from FIG. 10 according to the third preferred embodiment of the present invention. After removing the etching mask 34, a wet etching process is performed to widen the contact hole. 38. The wet etching process is preferably performed by using diluted hydrofluoric acid. In the third preferred embodiment of the present invention, there is no high-k dielectric layer 20. During the wet etching process, the second silicon oxide layer 40 formed from the mask layer 18 is entirely removed and part of the first silicon oxide layer 32 is removed as well. The diameter of the contact hole 38 in the first silicon oxide layer 32 and the mask layer 18 is widened. It is noteworthy that the diameter of the contact hole 38 in the first silicon oxide layer 32 and in the mask layer 18 can be different or the same. This embodiment takes the diameter D1 of the contact hole 38 in the first silicon oxide layer 32 larger than the diameter D2 of the contact hole 38 in the mask layer 18 as an example.

According to the preferred embodiment of the present invention, a contact hole with smaller diameter is formed by a dry etching process followed by using the wet etching process to widen the contact hole. Therefore, the contact plug formed in the widened contact hole has a lower resistance. Because the contact hole formed by the dry etching process has a smaller diameter, the tolerance of the shift and offset of the dry etching process is increased. In other words, possibility of the contact hole shifting out of range of the conductive line during the dry etching process is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a contact hole, comprising:
providing a conductive line, a mask layer covering and contacting the conductive line, a high-k dielectric layer covering and contacting the mask layer, and a first silicon oxide layer covering and contacting the high-k dielectric layer, wherein the high-k dielectric layer comprises a first metal oxide layer, a second metal oxide layer and a third metal oxide layer stacked from bottom to top;
performing a dry etching process to etch the first silicon oxide layer, the high-k dielectric layer, and the mask layer to expose the conductive line and form a contact hole; and
performing a wet etching process to etch the first silicon oxide layer, the third metal oxide layer and the second metal oxide layer to widen the contact hole, and the first metal oxide layer remains after the wet etching process.

2. The method of fabricating a contact hole of claim 1, wherein the first metal oxide layer is zirconium oxide, the second metal oxide layer is aluminum oxide and the third metal oxide layer is zirconium oxide.

3. The method of fabricating a contact hole of claim 1, further comprising:
forming an etching mask to cover the first silicon oxide layer before the dry etching process;
during the dry etching process, etching the first silicon oxide layer, the high-k dielectric layer and the mask layer by taking the etching mask as a mask; and
removing the etching mask before the wet etching process and after forming the contact hole.

4. The method of fabricating a contact hole of claim 3, wherein the mask layer is silicon carbonitride, and when removing the etching mask, part of the mask layer is oxidized to become a second silicon oxide layer, and during the wet etching process, the second silicon oxide layer is removed.

5. The method of fabricating a contact hole of claim 4, wherein the atomic percentage of carbon in the mask layer is between 5 at % and 40 at %.

6. The method of fabricating a contact hole of claim 1, wherein the mask layer is silicon nitride, and when removing the etching mask, part of the mask layer is oxidized to become a second silicon oxide layer, and during the wet etching process, the second silicon oxide layer is removed.

* * * * *